US010892099B2

(12) United States Patent
Kabir et al.

(10) Patent No.: US 10,892,099 B2
(45) Date of Patent: Jan. 12, 2021

(54) FRINGE CAPACITOR FOR HIGH RESOLUTION ADC

(71) Applicant: NXP USA, Inc., Austin, TX (US)

(72) Inventors: Mohammad N. Kabir, Tempe, AZ (US); Paul L. Hunt, Phoenix, AZ (US); Rakesh Shiwale, Chandler, AZ (US); Brandt Braswell, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 258 days.

(21) Appl. No.: 15/845,445

(22) Filed: Dec. 18, 2017

(65) Prior Publication Data

US 2019/0189350 A1 Jun. 20, 2019

(51) Int. Cl.
| | |
|---|---|
| H01L 23/552 | (2006.01) |
| H01L 27/108 | (2006.01) |
| H01L 29/76 | (2006.01) |
| H01G 4/30 | (2006.01) |
| H01G 4/232 | (2006.01) |
| H01L 49/02 | (2006.01) |
| H01L 23/522 | (2006.01) |
| H01G 4/33 | (2006.01) |
| H03M 1/12 | (2006.01) |

(52) U.S. Cl.
CPC .............. *H01G 4/30* (2013.01); *H01G 4/232* (2013.01); *H01G 4/33* (2013.01); *H01L 23/5223* (2013.01); *H01L 23/5225* (2013.01); *H01L 28/90* (2013.01); *H03M 1/12* (2013.01)

(58) Field of Classification Search
CPC . H01L 23/5223; H01L 23/5225; H01L 28/90; H01L 23/552; H01L 27/10835; H01G 4/232; H01G 4/33

USPC .................................................. 257/659, 303
See application file for complete search history.

(56) References Cited

U.S. PATENT DOCUMENTS

| | | | |
|---|---|---|---|
| 8,362,589 B2 | 1/2013 | Quinn | |
| 9,331,026 B1 | 5/2016 | Watt et al. | |
| 2009/0290283 A1 | 11/2009 | Fong et al. | |
| 2010/0078778 A1* | 4/2010 | Barth | H01L 21/568 257/659 |
| 2010/0127347 A1 | 5/2010 | Quinn et al. | |

(Continued)

OTHER PUBLICATIONS

Chun-Cheng Liu et al., a 10-bit 50-MS/s SAR ADC with a Monotonic Capacitor Switching Procedure, IEEE Journal of Solid-State Circuits, vol. 45, No. 4, Apr. 2010.

*Primary Examiner* — Jami Valentine Miller
*Assistant Examiner* — Dilinh P Nguyen

(57) ABSTRACT

A fringe capacitor with a shielded the top capacitor plate is formed in multiple interconnect layers to include a first plate having a first defined finger structure located in one or more middle interconnect layers to form a top capacitor plate; a set of second plates located in the middle interconnect layer(s) and bottom and top interconnect layers that are connected to form a bottom capacitor plate which includes a second plate in the middle interconnect layer(s) having defined finger structures that are interleaved with the first defined finger structure of the top capacitor plate to vertically and horizontally sandwich the top capacitor plate; and a set of shield layers formed to surround and shield the top capacitor plate on lateral sides, where the set of shield layers are connected to a reference voltage, thereby shielding the top capacitor plate from parasitic capacitance.

20 Claims, 6 Drawing Sheets

(56) References Cited

U.S. PATENT DOCUMENTS

2011/0057293 A1    3/2011  Tsai
2014/0049872 A1    2/2014  Huang et al.

\* cited by examiner

FRINGE CAPACITOR FOR HIGH RESOLUTION ADC

BACKGROUND OF THE INVENTION

Field of the Invention

The present invention is directed in general to the field of semiconductor circuit design. In one aspect, the present invention relates generally to the design and fabrication of a capacitor structure on a semiconductor substrate.

Description of the Related Art

In advanced semiconductor fabrication processes, the conductive lines or "wires" are so closely spaced that the lateral capacitance can be used to design high-quality "fringe capacitors" by using a finger structure on a given metal layer to combine lateral and vertical capacitances. The low-voltage coefficient and excellent matching properties of fringe and plate capacitors make them high precision components that are suitable for use with analog-to-digital converter (ADC, A/D, or A-to-D) systems that convert an analog signal into a digital signal. For example, a successive approximation register (SAR) ADC is a type of analog-to-digital converter that converts a continuous analog waveform into a discrete digital representation via a binary search through all possible quantization levels before finally converging upon a digital output for each conversion. In conventional SAR ADCs which use binary weighted split capacitor array (BWSC) structures to implement a digital-to-analog converter (DAC) input to a comparator, the total capacitance rises exponentially with the ADC resolution, leading to an exponential increase in the power consumption and RC time constant. While an attenuating capacitor may be employed to split the capacitor array to achieve a small capacitor ratio, faster DAC settling time, and low power consumption, the parasitic capacitance associated with the attenuating capacitor degrades the linearity performance of the converter, as the effect of the parasitic capacitance on the value of DAC voltage is not constant with input voltage. Of course, there can also be edge effects arising from capacitive coupling between adjacent capacitors. And since there can be significant variance in the parasitic capacitance of a fringe capacitor (e.g., +/−40%) at the process corners, it is important to reduce any variance in the value of the parasitic capacitance of the attenuating capacitor (which is derived using the non-integer ratio from the main capacitor) as compared to the integer capacitor since this can cause the calibration in high resolution converters to fail where the value of the attenuating or scaling capacitor sets the calibration range. Another potential problem with fringe capacitors used in switched capacitor gain stages is the presence of parasitic capacitances where the top plate of the sampling capacitor is connected to a summing junction of the comparator/opamp since any parasitic capacitance of the top plate increases the value of the feedback factor which degrades the settling performance of the gain stage, thereby leading to higher nonlinearity in the transfer function.

As seen frond the foregoing, the existing fringe capacitor structures having low top plate parasitic capacitance and good linear performance are extremely difficult at a practical level by virtue of the difficulty balancing the design constraints for providing a scalable, high capacitance fringe capacitor with good shielding and reduced top plate parasitic capacitance to improve linearity with switched capacitor circuit applications, such as SAR ADCs. Further limitations and disadvantages of conventional capacitor designs, processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
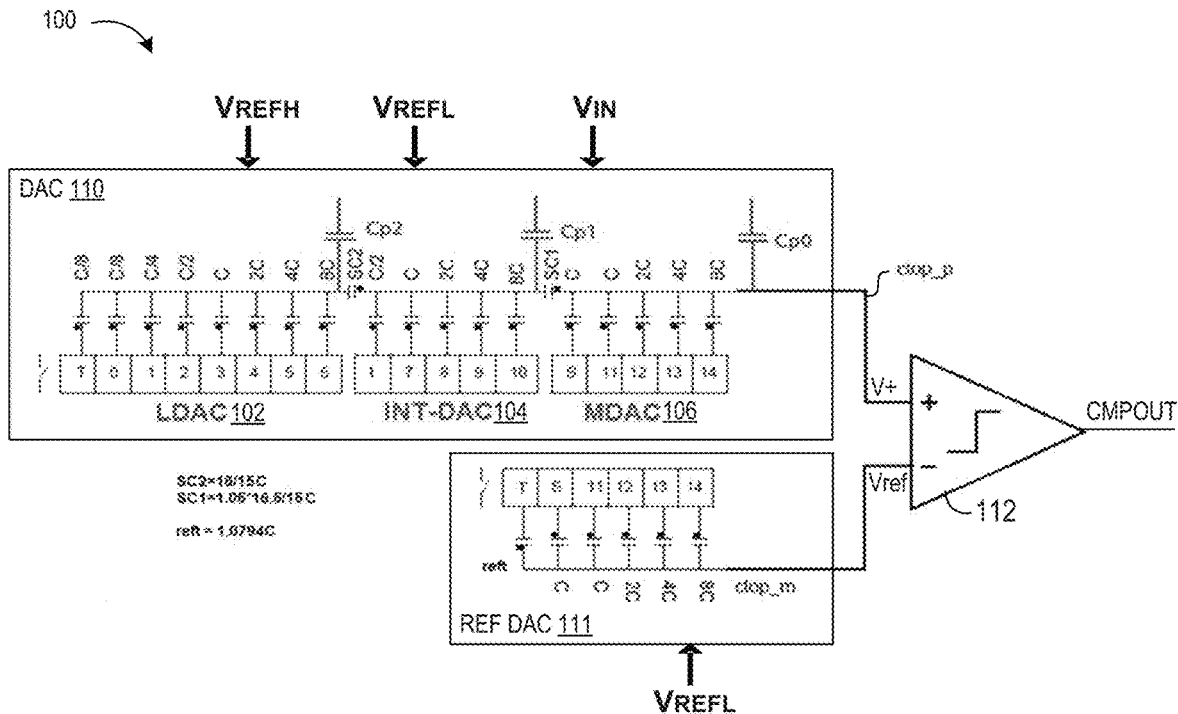
FIG. 1 depicts a circuit schematic diagram of a digital to analog converter (DAC) connected to a comparator as part of a successive approximation register analog-to-digital converter.

A capacitor design, structure, and method of fabrication are described for providing a shielded fringe capacitor with ultra-low top plate parasitic capacitance by forming one or more multi-finger top plate layers in the interconnect layer(s) to be vertically and horizontally sandwiched by multiple multi-finger bottom plate layers and surrounded on multiple sides by grounded lateral shielding layers, alone or in combination with floating vertical shield lines at the periphery, thereby providing the shielded fringe capacitor that is protected from edge effects, highly scalable, and suitable for integration in capacitor arrays. In selected embodiments, the shielded fringe capacitor is constructed as a metal-on-metal (MOM) capacitor with a columnar structure which includes a top plate having first finger extensions that is formed with conductive layers (and any required connecting via structures) on one or more intermediate interconnect levels, a bottom plate having second interdigitated finger extensions that is formed with conductive layers and connecting via structures on multiple interconnect levels to surround and sandwich the top plate both laterally and vertically on every side, and a lateral shield structure formed with conductive layers and connecting via structures on multiple interconnect levels and connected to a reference voltage to laterally shield the bottom and top plates on multiples sides from parasitic capacitance. In selected embodiments, additional shielding from substrate noise may be provided by connecting the lateral shield structure to defined poly silicon layers formed over the substrate and/or active regions in the substrate that are connected to the reference voltage and positioned below the shielded fringe capacitor to vertically shield the bottom and top plates from parasitic capacitance and other substrate noise. Additional protection may be provided by forming vertical shield conductive layers on multiple interconnect levels (with or without connecting via structures) at the peripheral sides of the shielded fringe capacitor to laterally shield the bottom and top plates from edge effects, where the symmetrical positioning of the vertical shield conductive layers promotes layout abutment between adjacent shielded fringe capacitors. In the disclosed embodiments, a first set of one or more conductive plates having a first defined finger structure are laid out in an interior core position of the capacitor to form a top plate of the capacitor that is vertically and horizontally sandwiched with a second set of conductive plates having defined finger structures that are connected by at least one via and interdigitated with the first defined finger structure to be positioned both inside and outside the interior core to form the bottom plate of the capacitor. To shield the capacitor formed by the top and bottom plates, a third set of conductive plates are laid out for connection together (and to optional poly and active regions) by at least one via to a reference voltage and positioned to laterally and vertically enclose and shield the top plate on multiples sides from parasitic capacitance. And to protect the capacitor from edge effects, a fourth set of conductive plates are laid out for connection together and positioned to laterally and vertically enclose and shield the top plate. By using a shielded fringe capacitor with interdigitated plate fingers that are shielded to provide an ultra-low parasitic top plate capacitance in the design of switched capacitor circuits (e.g., SAR ADC, cyclic, pipelined ADC, discrete time sigma delta modulator, switched capacitor filter), a highly scalable capacitor is provide that has reduced settling time, reduced nonlinearities due to DAC capacitor mismatch, and reduced or eliminated edge effects.

Many integrated circuits (ICs), including mixed-signal circuits that include both digital and analog components, oftentimes require high-performance capacitors configured on the chip. With small geometry fabrications processes now used to fabricate integrated circuits, the fringe-capacitance between metal lines within the same metal layer can be used to construct metal-to-metal capacitors as it is increasingly possible to control the spacing between the metal lines within the same metal layer through accurate lithography, even as capacitance between different metal interconnect layers has been difficult to control due to variations in the thickness of interlayer dielectric layers. With certain high performance capacitor applications, such as switched capacitor circuits, it has generally been desirable to design a well-matched capacitor in order to obtain high accuracy, preferably with a design that maximizes capacitive density in order to minimize the capacitor die area while also minimizing the top plate parasitic capacitance in order to avoid electric charge being drained from critical nodes of the system. In addition to reducing power consumption, a reduced top plate parasitic capacitance reduces a source of errors in switched capacitor circuits. While some solutions address this by shielding the top plate using the metal layer closest to the substrate (or bottom metal layer), this approach reduces the capacitance density of the fringe capacitor since the bottom metal layer cannot be used when forming the fringe capacitor.

To provide a contextual example where selected embodiments of the present disclosure may advantageously be used, reference is now made to FIG. 1 which shows a circuit schematic diagram 100 of a digital to analog converter (DAC) 110 connected to a comparator 112 as part of a high resolution analog-to-digital converter (ADC), such as a successive approximation register ADC in accordance with selected single-ended embodiments. The depicted portion of the SAR ADC includes first and second digital-to-analog converters (DAC) 110, 111, each of which may be embodied with a capacitor array that is connected, respectively, to the non-inverting and inverting inputs of a comparator 112 which generates a comparator output (CMPOUT). The comparator output is connected to an SAR register and control logic (not shown) which may be configured as a sequencer that initially generates control signals for controlling the DAC 110 to sample and convert the received analog input voltage VIN to a corresponding binary value having a resolution of n bits in which "n" is a positive integer greater than 1. At the DAC 110, the analog input voltage YIN is initially sampled during a sampling phase with an array of binary weighted capacitors, each corresponding to a binary digit of the binary value obtained from the ADC. Each capacitor in the array is connected by a switching circuit (not shown) to charge the top plates of each binary weighted capacitor to a common mode voltage (VCM), and the bottom plates of the binary weighted capacitors may be switched between a first voltage VREFH, a second voltage VREFL, and a third voltage VIN, where VREFL≤VIN≤VREFH. In similar fashion, the reference DAC 111 is connected to receive the reference voltage VREFL which is also sampled with binary weighted capacitors during a conversion operation to generate the output reference voltage Vref for connection to the inverting input of the comparator 112. With the outputs from the DACs 110, 111 connected, respectively, as inputs to the non-inverting and inverting terminals, the comparator 112 compares the input voltages V+, Vref to provide a binary output (CMPOUT) corresponding to each comparison. In the depicted capacitor array of the DAC 110, attenuating or scaling capacitors Sc1, Sc2 are included to split the array into multiple array portions, including an LDAC array 102 (for the least significant bits), INT-DAC array 104 (for the intermediate significant bits), and MDAC array 106 (for the most significant bits), thereby reducing the total capacitance, power consumption, and RC time constant. But even with the split array structure, there can still be the parasitic capacitance effects Cp1 and Cp2 associated the top plates of the attenuating capacitors and comparator input that can degrade the linearity performance of the converter.

Figure 2:
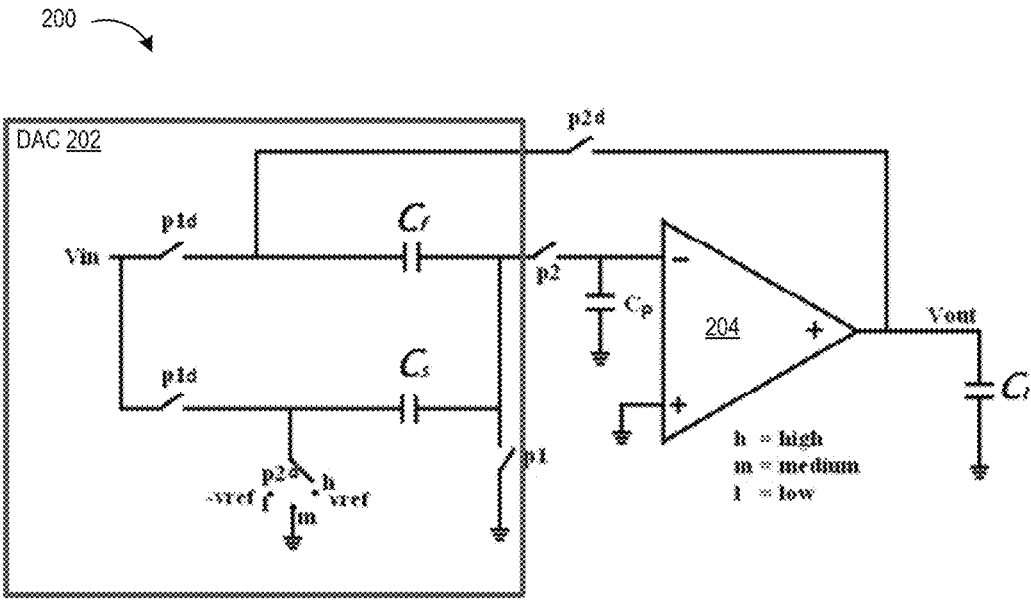
FIG. 2 depicts a circuit schematic diagram of a switched capacitor gain stage showing how the top plate parasitic capacitance affects the gain stage feedback factor.

To illustrate the effects of the top plate parasitic capacitance, reference is now made to FIG. 2 which depicts a circuit schematic diagram of a switched capacitor gain stage 200 wherein the top plates of the switched capacitor inputs from the DAC are connected to the summing node of the op amp 204 such that any parasitic capacitance of the top plate Cp decreases the value of the feedback factor, thereby degrading the settling performance of the gain stage which leads higher nonlinearity in the transfer function.

To provide additional details for an improved understanding of selected embodiments of the present disclosure, reference is now made to FIGS. 3a-f which sequentially depict plan views of different layout layers that may be used in the formation of a shielded metal-oxide-metal (MOM) fringe capacitor with ultra-low top plate parasitic capacitance in accordance with selected embodiments of the present disclosure. While disclosed with reference to selected embodiments where the MOM fringe capacitor includes an ultra-low multi-finger top plate layer 323, multi-fingered bottom plate layers 310, 320, 330, grounded lateral shielding layers 311, 321, 331, and floating vertical shielding layers 312, 322, 332 that are formed with at least three parallel conducting layers (e.g., M1, M2, and M3) connected as indicated by via structures, it will be appreciated that one or more additional interconnect layers and/or layout configurations may be used to form the top or bottom capacitor plates. For example, the top plate capacitor may be formed with multiple intermediate conductive layers e.g., M2, M3, and M4) that are sandwiched between a bottom interconnect layer M1 (used to form the bottom-most layer of the bottom plate) and top interconnect layer M5 (used to form the top-most layer of the bottom plate). In addition, the specific configuration and spacing of the multi-finger top and bottom plate layers may include additional elongated finger elements having any desired length and spacing, provided that the geometric features are manufacturable and properly aligned to provide desired capacitance. For example, the multi-finger top plate layers) may include eight extension fingers and the multi-finger bottom plate layers may include nine interdigitated extension fingers at the intermediate conductive layers and seventeen interdigitated extension fingers at the bottom-most and top-most conductive layers. In addition, any desired arrangement of via structure interconnects may be used that provides the requisite capacitor structure functionality.

Figure 3A:
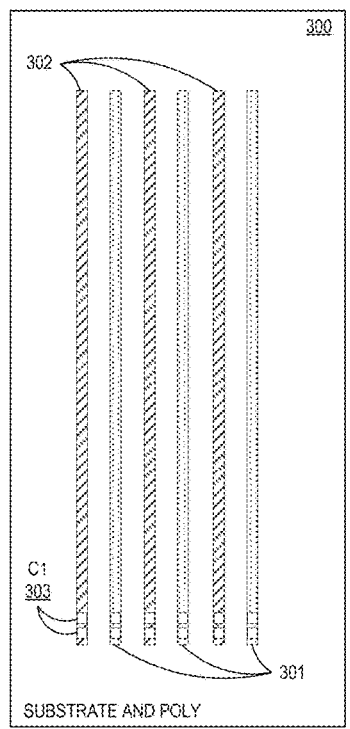
FIGS. 3a-f depict plan views of different layout layers that may be used in the formation of a shielded fringe capacitor with ultra-low top plate parasitic capacitance in accordance with selected embodiments of the present disclosure.

Referring now to FIG. 3a, there is shown a plan view of a substrate area 300 in which a plurality of defined active regions 301 and polysilicon layers 302 may be formed for connection to the grounded lateral shielding layers to provide bottom plate shielding against capacitive coupling from the substrate or other substrate noise. As will be appreciated by those skilled in the art, the defined active regions 301 may be formed in the substrate 300 by using any desired masked implantation or diffusion process in which conductive impurities selectively form the active regions 301 which are aligned in the direction of the later-formed multi-fingered plate layers with a lateral offset to provide shielding against bottom plate parasitic capacitance. In addition, the defined poly layers 302 may be formed as elongated, finger-shaped elements over the substrate 300 using any desired selective formation process, such as masking and selectively etching a deposited polysilicon layer to form patterned poly layers 302 which are aligned in the direction of the later-formed multi-fingered plate layers with a lateral offset to provide shielding against bottom plate parasitic capacitance. The width and spacing of the active regions 301 and defined poly layers 302 may be set based on the available fabrication technology so as to achieve appropriate alignment and offset from the subsequently formed interconnect layers e.g., M1). As will be appreciated, the placement and location of the defined active regions 301 and polysilicon layers 302 may also extend at least the full length of the later-formed multi-fingered plate layers to protect against parasitic capacitance from the substrate. While additional active regions 301 and/or polysilicon layers 302 may be used to enhance shielding, this can increase the capacitive coupling to the bottom plate. In addition, the active regions 301 and/or polysilicon layers 302 may be removed for certain no-shield embodiments where there is low bottom plate capacitance (e.g., for series attenuation capacitors in SAR ADCs), but there are fabrication benefits from including the active regions 301 and/or polysilicon layers 302, such as meeting the tiling density requirements to prevent dishing during manufacture. For embodiments where the active regions 301 and polysilicon layers 302 are connected to the subsequently-formed grounded lateral shielding layers, FIG. 3a shows that metal contact structures C1 303 may be formed in alignment with the features 301, 302 using any desired interconnect formation process and placement pattern.

Figure 3B:
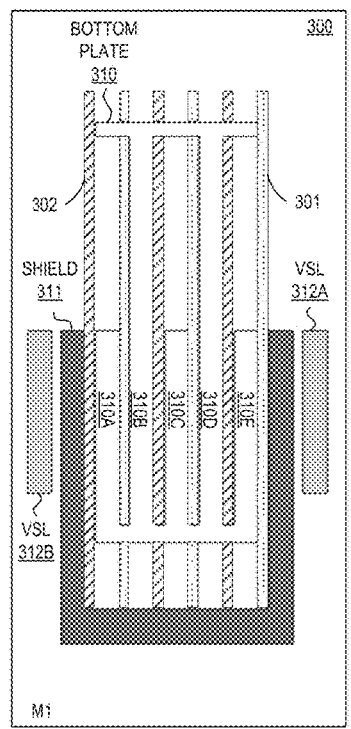

In FIG. 3b, there is shown a plan view of a first metal layer (e.g., M1) which is formed over the substrate area 300, active regions 301 and polysilicon layers 302 to define a first multi-finger bottom plate layer 310 that is surrounded on multiple sides by a lateral shielding layer 311 and peripherally positioned floating vertical shield lines 312A, 312B. As will be appreciated by those skilled in the art, the defined bottom plate 310, lateral shielding layer 311, and floating vertical shielding lines 312 may be formed with any desired interconnect formation process whereby a conductive layer (e.g., M1) is deposited over a planarized insulating or dielectric layer and then selectively patterned and etched to achieve the desired layout of layers which are aligned with the underlying metal contact structures C1 303. In selected embodiments, the first multi-finger bottom plate layer 310 includes any number of downwardly extending elongated finger elements 310B, 310D (e.g., 2 to 8 or more) which are positioned for vertical alignment with any number of the subsequently-formed top plate finger elements, and may also include any number of upwardly extending elongated finger elements 310A, 310C, 310E (e.g., 3 to 9 or more) which are laterally offset from the subsequently-formed top plate finger elements. In addition, one or more lateral shielding layers 311 are formed as separately defined peripheral conductive features on one or more sides of the bottom plate 310 for connection to a reference voltage (e.g., ground) to provide shielding against parasitic capacitance from adjacent capacitors. In addition, one or more vertical shielding layers (VSL) 312A-B are formed as separately defined peripheral conductive features on one or more sides of the lateral shielding layers 311 to provide floating shield protection against edge effects from adjacent capacitors. In effect, the floating VSL layers 312A-B act as dummy fingers to reduce or eliminate edge effects.

Figure 3C:
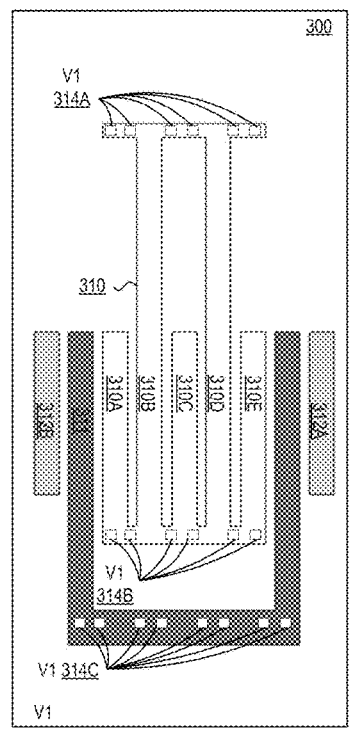

To enable electrical connection to subsequently-formed layers in the capacitor, FIG. 3c shows a plan view of the first metal layer (e.g., M1) (but not the underlying active regions 301 and polysilicon layers 302) after via structures 314A-C are formed in alignment with the first multi-finger bottom plate layer 310 and lateral shielding layer 311. As illustrated, a first set of via structures V1 314A are formed on an upper bridge portion of the first multi-finger bottom plate layer 310 while a second set of via structures V1 314B are formed on a lower bridge portion of the first multi-finger bottom plate layer 310, thereby providing good electrical connection to the subsequently-formed bottom plate structures. In addition, a third set of via structures V1 314C are formed on a bridge portion of the lateral shielding layer 311 to enable good electrical connection to the subsequently-formed lateral shielding layer structures. As will be appreciated by those skilled in the art, the via structures 314A-C may be formed with any desired interconnect formation process, such as by depositing a planarized insulating or dielectric layer, masking and selectively etching via openings using any desired via placement and etch pattern, and then filling the via openings with one or more conductive layers to form the structures 314A-C.

Figure 3D:
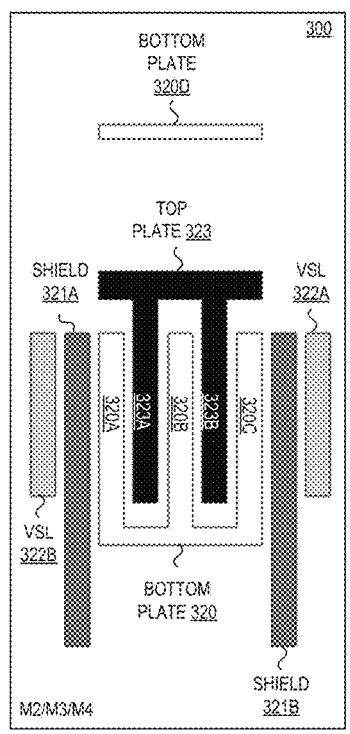

Referring now to FIG. 3d, there is shown a plan view of a second metal layer (e.g., M2) which is formed over the substrate area 300 and underlying layers, such as the M1 layer (not shown), to define a second multi-finger bottom plate layer 320 and a first multi-finger top plate layer 323 that are positioned for interdigitated alignment of their respective elongated finger elements 320A-C, 323A-B, and that are surrounded on multiple sides by a lateral shielding layer 321A, 321B and peripherally positioned floating vertical shield lines 322A, 322B. As will be appreciated by those skilled in the art, the defined bottom plate 320, top plate 323, lateral shielding layer 321, and floating vertical shielding lines 322 may be formed with any desired interconnect formation process whereby a conductive layer (e.g., M2) is deposited over a planarized insulating or dielectric layer and then selectively patterned and etched to achieve the desired layout of layers which are aligned with the underlying via structures 314 (not shown). In selected embodiments, the second multi-finger bottom plate layer 320 includes a lower bridge element with upwardly extending elongated finger elements 320A-C which are aligned with and laterally offset from the top plate finger elements 323A-B. In addition, the second multi-finger bottom plate layer 320 may include an upper bridge element 320D that is positioned for electrical connection to the bottom plate layers, and that includes vertical finger extensions 323A, 323B that extend down without connecting to the lower bridge element of the second multi-finger bottom plate layer 320. Peripherally surrounding the second multi-finger bottom plate layer 320 are one or more lateral shielding layers 321A-B that are formed as separately defined peripheral conductive features on one or more sides of the bottom plate 320 for connection to a reference voltage (e.g., ground) to provide shielding against parasitic capacitance from adjacent capacitors. In addition, one or more vertical shielding layers 322A-B are formed as separately defined peripheral conductive features on one or more sides of the lateral shielding layers 321A-B to provide floating shield protection against edge effects from adjacent capacitors.

Figure 3E:
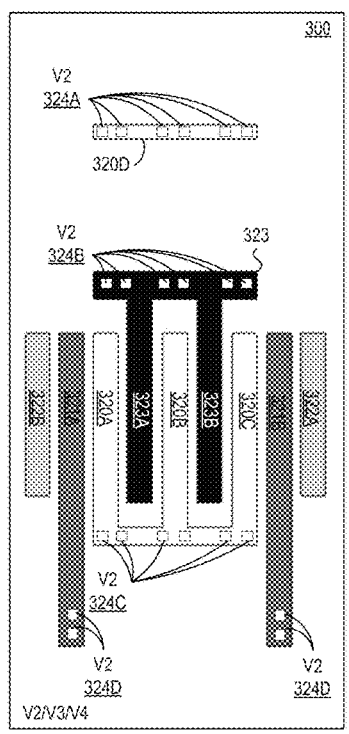

To enable electrical connection to subsequently-formed layers in the capacitor, FIG. 3*e* shows a plan view of the second metal layer (e.g., M2) from FIG. 3*d* after via structures 324A-D are formed in alignment with the second multi-finger bottom plate layer 320, first multi-finger top plate layer 323, and lateral shielding layer 321. As illustrated, a first set of via structures V2 324A are formed on the upper bridge element 320D of the second multi-finger bottom plate layer 320 while a second set of via structures V2 324C are formed on a lower bridge portion of the second multi-finger bottom plate layer 320B, thereby providing good electrical connection to the subsequently-formed bottom plate structures. In addition, a third set of via structures V2 314B are formed on the first multi-finger top plate layer 323 if needed to enable good electrical connection to any subsequently-formed top plate layers, and a fourth set of via structures V2 314D are formed on the lateral shielding layers 321A-B to enable good electrical connection to the subsequently-formed lateral shielding layer structures. As will be appreciated by those skilled in the art, the via structures 324A-D may be formed with any desired interconnect formation process, such as by depositing a planarized insulating or dielectric layer, masking and selectively etching via openings using any desired via placement and etch pattern, and then filling the via openings with one or more conductive layers to form the structures 324A-D. As will be appreciated, the layout of the M2 layers shown in FIGS. 3*d-e* may be repeated one or more times with successive interconnect layers (e.g., M3, M4) to form a stacked multi-finger top capacitor plate that is vertically and horizontally sandwiched by multiple multi-finger bottom plate layers and surrounded on multiple sides by grounded lateral shielding layers and by floating vertical shield lines at the peripheral edges of the capacitor structure.

Figure 3F:
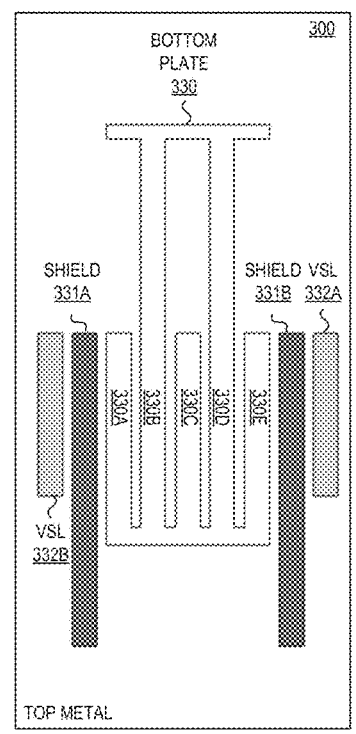

Referring now to FIG. 3*f*, there is shown a plan view of a top most metal layer (e.g., M3) which is formed over the substrate area 300 and underlying layers, such as the M2 layer (not shown), to define a top-most multi-finger bottom plate layer 330 that is surrounded on multiple sides by a lateral shielding layer 331A-B and peripherally positioned floating vertical shield lines 332A-B. As will be appreciated by those skilled in the art, the defined bottom plate 330, lateral shielding layer 331, and floating vertical shielding lines 332 may be formed with any desired interconnect formation process whereby a conductive layer (e.g., M3) is deposited over a planarized insulating or dielectric layer and then selectively patterned and etched to achieve the desired layout of layers which are aligned with the underlying metal contact and/or via structures 324A-D (not shown). In selected embodiments, the top-most multi-finger bottom plate layer 330 includes any number of downwardly extending elongated finger elements 330B, 330D (e.g., 2 to 8 or more) which are positioned for vertical alignment with any number of the previously-formed top plate finger elements in the lower interconnect layers, and may also include any number of upwardly extending elongated finger elements 330A, 330C, 330E (e.g., 3 to 9 or more) which are laterally offset from the previously-formed top plate finger elements. In addition, one or more lateral shielding layers 331A-B are formed as separately defined peripheral conductive features on one or more sides of the bottom plate 330 for connection to a reference voltage (e.g., ground) to provide shielding against parasitic capacitance from adjacent capacitors. In addition, one or more vertical shielding layers 332A-B are formed as separately defined peripheral conductive features on one or more sides of the lateral shielding layers 331 to provide floating shield protection against edge effects from adjacent capacitors.

Figure 4:
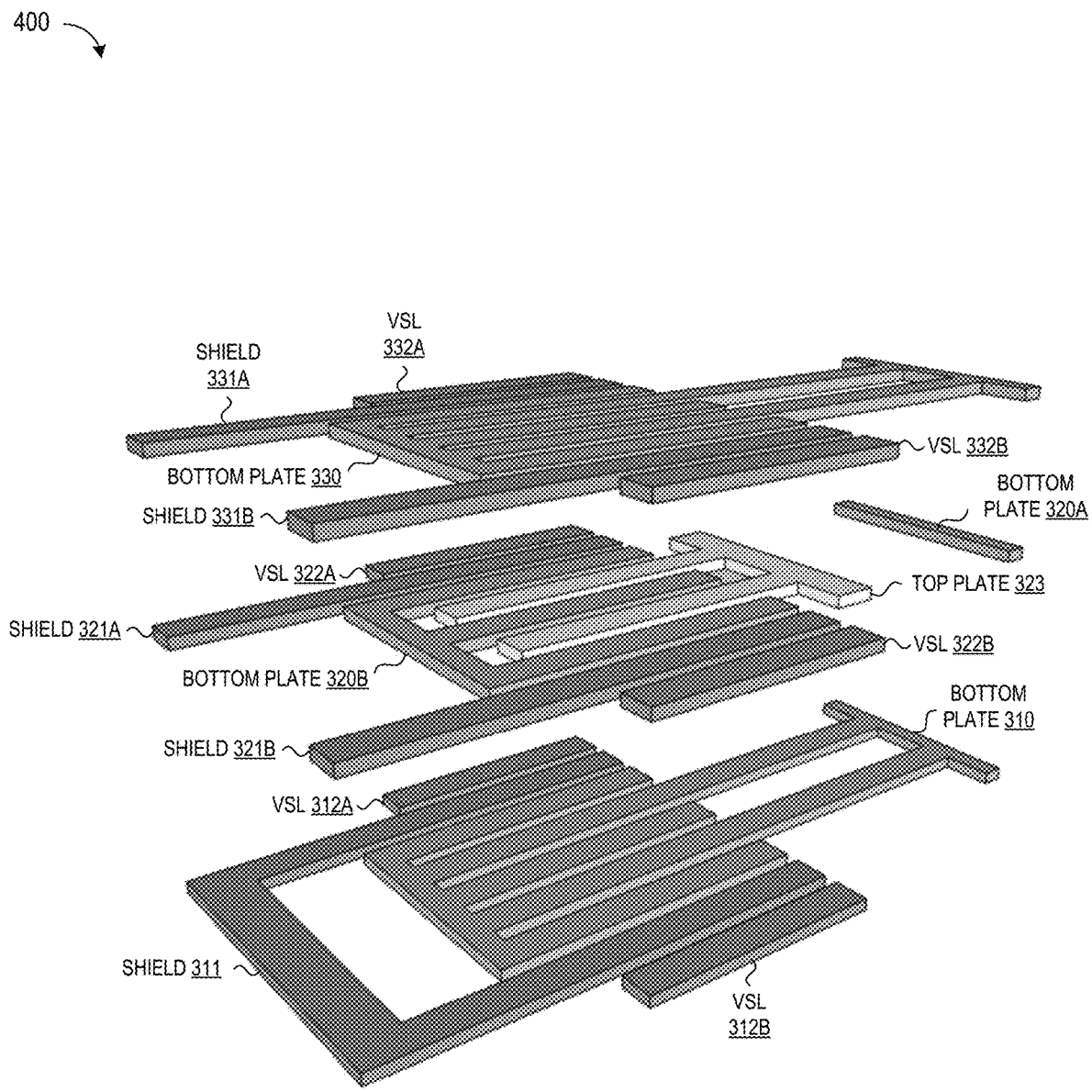
FIG. 4 depicts a perspective view of the metal layers in the shielded fringe capacitor constructed as depicted in FIGS. 3a-f.

To illustrate how the substrate and metals layers depicted in FIGS. 3*a-f* can be assembled to fabricate a shielded fringe capacitor, reference is now made to FIG. 4 which depicts a perspective view of the metal layers (but not via structures) used to fabricate a MOM fringe capacitor 400 with ultra-low top plate parasitic capacitance that is protected from edge effects, highly scalable, and suitable for integration in capacitor arrays. The depicted MOM fringe capacitor is shown as being formed with three conducting interconnect layers (M1, M2, M3). As depicted, the middle or M2 conductive interconnect layer is patterned to form a first set of one or more conductive plates 323 having a first defined finger structure laid out in an interior core position to form a top plate of the capacitor. The middle (M2) conductive interconnect layer is also patterned to form a second set of conductive plates 320A-B having defined finger structures which are laid out for interdigitated alignment with the first defined finger structure of the top plate 323, thereby horizontally sandwiching the first defined finger structure of the top plate 323. On one or more peripheral sides of the bottom plate layer 320, the middle (M2) conductive interconnect layer is patterned to form a third set of conductive plates 321A-B which are connected to a reference voltage (e.g., ground) to laterally shield the top plate from parasitic capacitance, along with a fourth set of conductive plates 322A-B as vertical shield layers (VSL) which are floating to protect against edge effects from adjacent capacitors.

To provide a compact capacitor layout with shielding against top plate parasitic capacitance, the lower (M1) and upper (M3) conductive interconnect layers are also patterned to form bottom plates that are positioned, aligned and laid out to vertically sandwich the patterned elements in the middle (M2) conductive interconnect layer with any required via connections (not shown). In particular, the bottom (or M1) conductive interconnect layer and top (or M3) conductive interconnect layer are each patterned to form bottom plate layers 310, 330 as a set of one or more conductive plates having defined finger structures which are laid out for vertical alignment with the defined finger structures of the top plate 323 and bottom plate 320B, thereby vertically sandwiching the first defined finger structure of the top plate 323. In addition, the lower (M1) and upper (M3) conductive interconnect layers are each patterned to form one or more shield layers 311, 331A-B at on one or more peripheral sides of the bottom plate layer 310, 330 so as to be aligned with and connected across vias (not shown) to the grounded third set of conductive plates 321A-B to laterally shield the top plate from parasitic capacitance. Finally, the lower (M1) and upper (M3) conductive interconnect layers may also be patterned to form one or more vertical shield layers (VSL) 312A-B, 332A-B on each side of the MOM fringe capacitor 400 so as to be aligned with and connected across vias (not shown) to the fourth set of conductive plates 322A-B to protect against edge effects from adjacent capacitors.

As disclosed herein, the shielded MOM fringe capacitor provides a design cell that is highly scalable to meet any desired capacitance value, simply by changing number of fingers and finger length since the capacitance value is proportional to the finger length. In this way, the shielded MOM fringe capacitor provides very good control over capacitance value for non-integer series capacitors that may be advantageously employed with binary weighted split capacitor arrays. An additional advantage of the disclosed fringe capacitor design cell arises from the unique design of the patterned bottom plate layers, top plate layer(s), and peripheral shield layers Whereby that the bottom plates are shielded from one another when placed in an array by virtue of the grounded peripheral shield layers which reduce or eliminate bottom plate-to-bottom plate coupling, thereby reducing settling time.

Figure 5A:
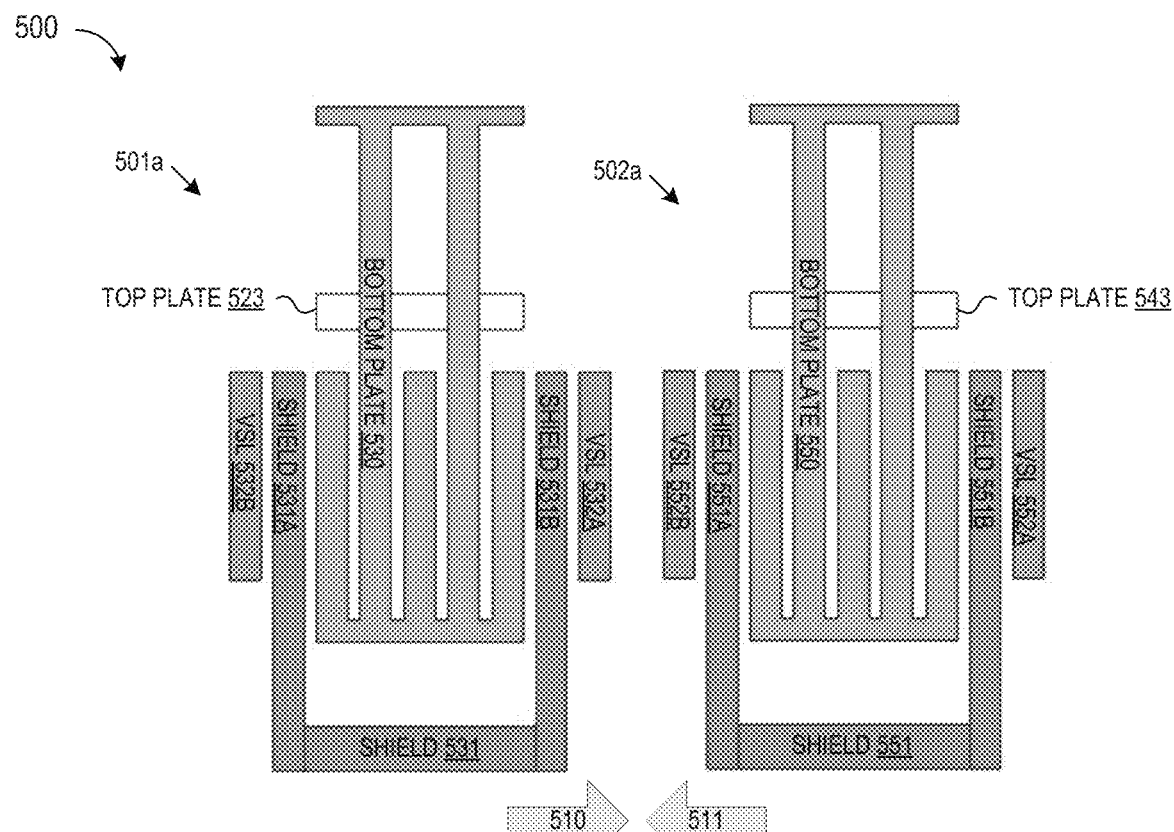
FIGS. 5a-b depict a plan view of the metal layers in two adjacent shielded fringe capacitors which are shifted into overlapping positions to demonstrate symmetry in abutment between adjacent shielded fringe capacitors.
Figure 5B:
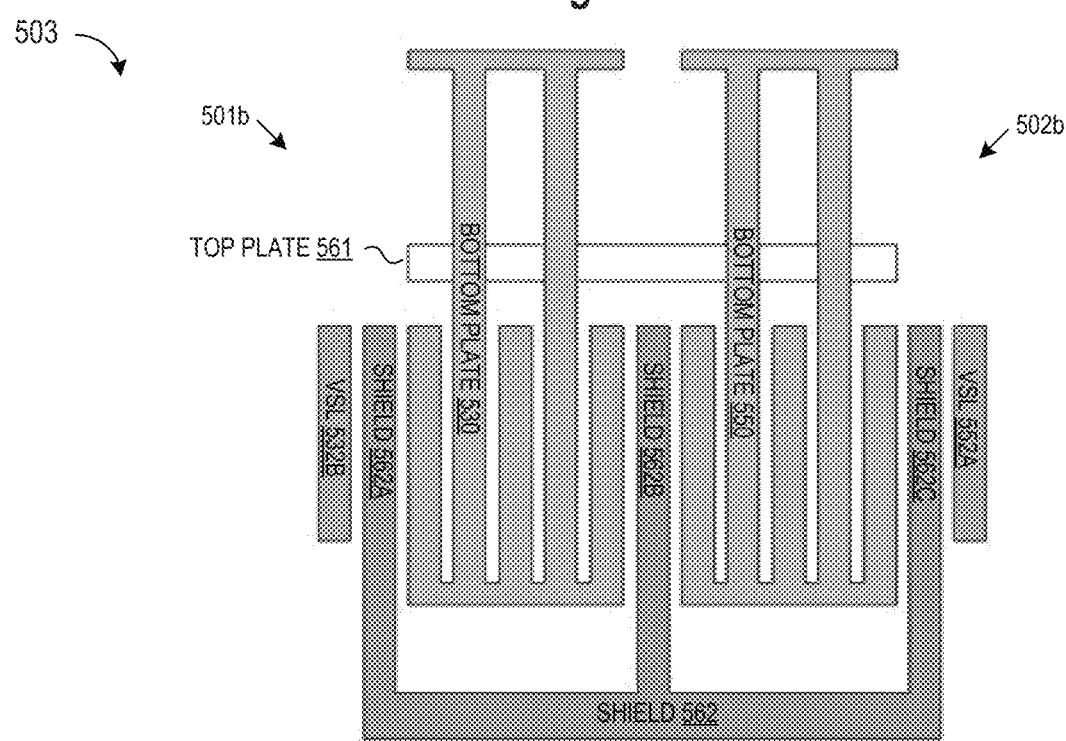

Yet another advantage of the disclosed fringe capacitor design cell arises from the unique design of the peripherally placed floating vertical shield layers in each cell which facilitate easy abutment of adjacent capacitor cells. To illustrate this, reference is now made to FIGS. 5a-b which depict a plan view of the metal layers in two adjacent shielded fringe capacitors 501a, 502a which are shifted into overlapping positions to demonstrate symmetry in abutment between adjacent shielded fringe capacitors. In particular, FIG. 5a depicts a plan view 500 of two capacitor cells 501a, 502a, each formed from the conductive interconnect layers (e.g., M1-M3) depicted in FIGS. 3a-f to define a multi-finger top plate layer 523, 543 (only partially visible where exposed) that is vertically and horizontally sandwiched by multiple multi-finger bottom plate layers 530, 550 and surrounded on multiple sides by grounded lateral shielding layers 531A-B, 551A-B in combination with floating vertical shield lines 532A-B, 552A-B located at peripheral side edges. By shifting the position the first capacitor 501a to the right (510) and shifting the position the second capacitor 502a to the left (511), the two capacitor cells 501a, 502a are shifted into partially overlapping positions with a shared top plate layer 561 and with the interior floating vertical shield lines 532A, 532B being displaced in favor of an interior shield finger element 562B from the grounded lateral shielding layer 562A-C which is formed from an overlapping arrangement between the grounded lateral shielding layer 531B and grounded lateral shielding layer 551A. The resulting abutment is shown in FIG. 5b which depicts a plan view 500 of two capacitor cells 501b, 502b formed from the conductive interconnect layers (e.g., M1-M3) to include a shared multi-finger top plate layer 561 (only partially visible where exposed) that is vertically and horizontally sandwiched by multiple multi-finger bottom plate layers 530, 550 and surrounded on multiple sides by grounded lateral shielding layers 562A-C and peripheral floating vertical shield lines 532B, 552A.

Figure 6:
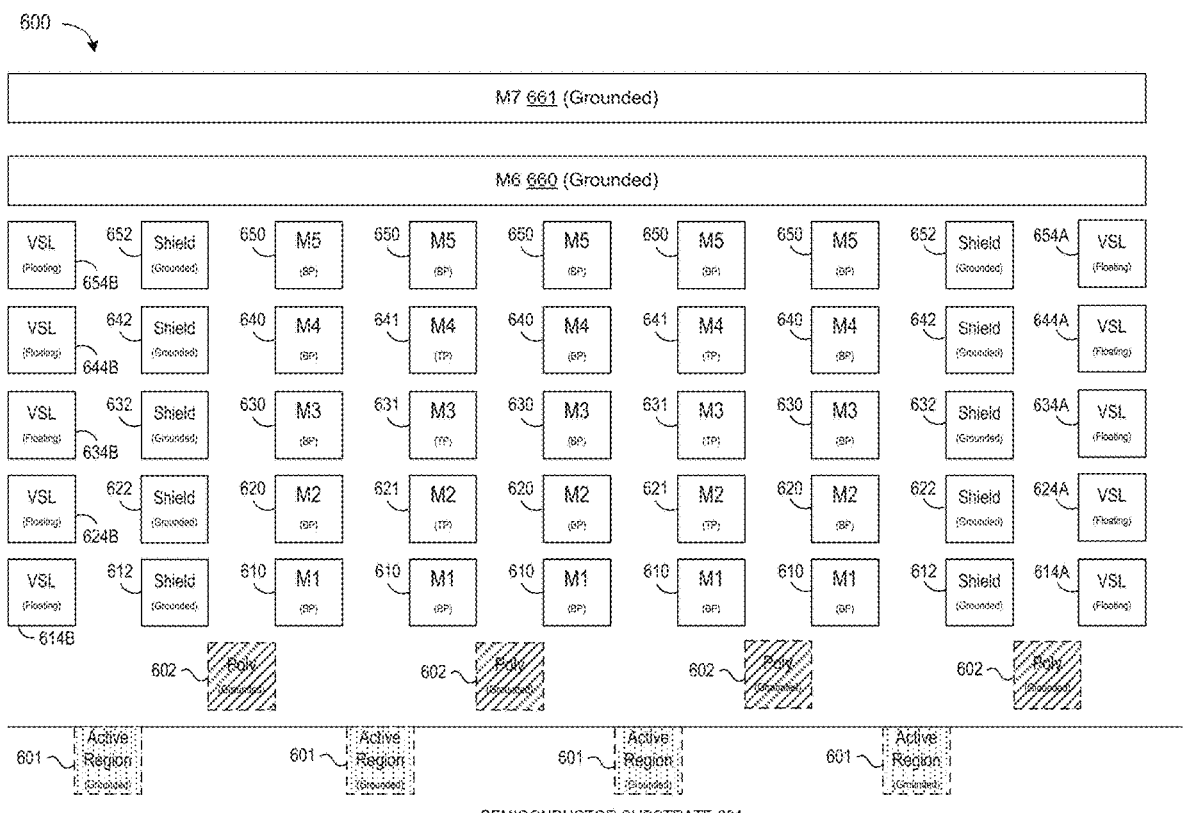
FIG. 6 depicts a side view of the integrated circuit layers used to form a shielded fringe capacitor in accordance with selected embodiments of the present disclosure.

To provide additional details for an improved understanding of selected embodiments of the present disclosure, reference is now made to FIG. 6 which depicts a side view 600 of the integrated circuit layers used to form a shielded fringe capacitor in accordance with selected embodiments of the present disclosure. To provide substrate shielding, the semiconductor substrate 601 may include active regions 601 implanted into the substrate 601 and conductive polysilicon layers 602 formed over the substrate 601 which are connected to a reference voltage (e.g., ground) to provide bottom plate shielding against capacitive coupling from the substrate or other substrate noise.

On a planarized dielectric layer formed over the conductive polysilicon layers 602, a first conductive metal (M1) layer may be patterned and etched to form a plurality of bottom plate (BP) layers 610 located at an inner core area as part of a multi-fingered bottom plate in the first metal (M1) layer which are laterally offset from the underlying active regions 601 and conductive polysilicon layers 602. In addition, the patterned first conductive metal (M1) layer also forms grounded lateral shielding layers 612 on opposed sides of the bottom plate layers 610 to shield against top plate capacitance, along with vertical shielding layers 614A, 614B on peripheral opposed sides of the capacitor 600 to shield against capacitive side effects from adjacent capacitors.

The next conductive metal (M2) layer is also formed over a planarized dielectric layer and any contacts (not shown) to the underlying active regions 601 and conductive polysilicon layers 602, and then patterned and etched to form multi-fingered bottom plate layers 620 and multi-fingered top plate layers 621 which are arrayed in parallel at the inner core area. Similar to the plates 320, 323 shown in FIG. 4, the bottom plate layers 620 sandwich the top plate layers 621 laterally on each side, and are also vertically aligned with corresponding bottom plate layers 610 from the first conductive metal (M1) layer. By the same token, the top plate layers 621 are also vertically aligned with alternating corresponding bottom plate layers 610 from the first conductive metal (M1) layer. In addition, the patterned second conductive metal (M2) layer forms grounded lateral shielding layers 622 on opposed sides of the bottom plate layers 620 to shield against top plate capacitance, and also forms vertical shielding layers 624A, 624B on peripheral opposed sides of the capacitor 600 to shield against capacitive side effects from adjacent capacitors, similar to the shield layer 321 and VSL layer 322 shown in FIG. 4. If desired, this same pattern of features may be formed over another planarized dielectric layer in the next (third) conductive metal (M3) layer to form multi-fingered bottom plate layers 630 aligned with the bottom plate layers 620, multi-fingered top plate layers 631 aligned with the top plate layers 621, grounded lateral shielding layers 632 aligned with the grounded lateral shielding layers 622, and vertical shielding layers 634A, 634B aligned with the VSL layers 6244, 624B. In addition, the next (fourth) conductive metal (M4) layer may also be patterned over another planarized dielectric layer to form multi-fingered bottom plate layers 640, multi-fingered top plate layers 641, grounded lateral shielding layers 642 on opposed sides of the bottom plate layers 640, and vertical shielding layers 634A, 644B as shown. And to finish the capacitor structure, the top-most (fifth) conductive metal (M5) layer may also be formed over another planarized dielectric layer and patterned to form multi-fingered bottom plate layers 650 located over the inner core area, similar to the bottom plate 330 shown in FIG. 4. As formed, the multi-fingered bottom plate layers 650 are aligned with the underlying bottom and top plate layers 640-641. The patterning of the top-most (fifth) conductive metal (M5) layer also forms grounded lateral shielding layers 652 on opposed sides of the bottom plate layers 650 which are aligned with the underlying shield layers 642, as well as vertical shielding layers 654A, 654B which are aligned with the underlying VSL layers 644A, 644B as shown. For additional shielding of the fringe capacitor 400, one or more additional conductive metal layers 660-661 (M6, M7) may be sequentially formed over the fringe capacitor 400 and connected in common to the connected to a reference voltage (e.g., ground) with the lateral shielding layers 614, 624, 634, 644, 654 to provide additional shielding. In selected embodiments, the additional conductive metal layers (M6, M7) may each be patterned and etched to run orthogonally (e.g., horizontally) from the alignment of the bottom and top plate layers in order to meet metal density requirements, thereby providing symmetry so that the shielded fringe capacitor may be used with smaller size unit capacitors.

As disclosed herein, the design, structure and method of fabricating the shielded fringe capacitor provides an ultra-low top plate parasitic capacitance that may be used with any number of switched capacitor circuits, such as SAR ADCs, discrete time delta-sigma modulator ADCs, switched capacitor filters, and the like where asymmetric parasitic capacitance (lower top plate parasitics than bottom plate) is used. In such applications where the top plate is very sensitive to parasitic capacitance, nonlinearity associated with the top plate parasitic capacitance is reduced by using the shielded fringe capacitor of the present disclosure to provide a capacitor cell design having a bottom capacitor plate that is formed to surround the top plate layer(s) on the top, bottom and sides, along with grounded shielding layers formed to surround the bottom plate layers on the top, bottom and sides. In this way, a highly linear metal fringe capacitor with very low top plate parasitic capacitance may be used for high resolution ADCs (e.g., a 15 bit SAR ADC) since the reduced top plate parasitic capacitance improves the linearity, thereby reducing missing code issues that can otherwise result from the SAR ADC operation. As a consequence, the overall yield of the product improves in addition, the fringe capacitor cell design may be laid out for easy abutment of adjacent capacitor cells in an array such that the bottom plates of interdigitized capacitors in the array are shielded from each other to prevent bottom plate to bottom plate coupling, thereby reducing settling time. Additional shielding may be provided by fabricating the fringe capacitor to include grounded poly and active regions as substrate shield elements, along with additional metal interconnect layers (e.g., M6, M7) that are grounded and placed horizontally over the fringe capacitor as vertical shield elements. However, the substrate and/or vertical shielding elements may be omitted with some fringe capacitor applications, such as series attenuation capacitors having low bottom plate capacitance. Another advantage of the disclosed fringe capacitor is the floating vertical shield layer (VSL) elements on each side of the capacitor which can serve multiple purposes, including reducing or eliminating edge effects from adjacent dummy capacitors which are laid out to share a single, common VSL element. By using a replicated finger configuration for the bottom and top plate layers with external shielding on the top, bottom and sides, the disclosed fringe capacitor design makes optimum use of the metal interconnect layers to achieve high capacity density (e.g., 0.79 f/$\mu$m$^2$) that is highly scalable by simply changing number of fingers and finger length.

It will be appreciated that any suitable processing steps may be used to fabricate the shielded fringe capacitor structure described herein, such as substrate preparation; preparation and formation of one or more sacrificial oxide layers and/or shallow trench isolation regions; masking and selective implantation of active regions; deposition of one or more dielectric layers over the substrate; formation of substrate contact structures in the dielectric layer(s); the deposition, patterning and etching of polysilicon layers; formation of planarized insulating layers over the poly silicon layers; formation of substrate contact structures in the planarized insulating layers; backend processing steps to form multiple levels of conductive interconnect layers in which the fringe capacitor is formed as disclosed herein to achieve the desired functionality. Thus, the specific sequence of steps used to complete the fabrication of the fringe capacitor structures may vary, depending on the process and/or design requirement.

By now it should be appreciated that there has been provided a shielded fringe capacitor formed in multiple conductive interconnect layers and associated method of fabrication. The disclosed capacitor includes a set of one or more first conductive plates having a first defined finger structure laid out in an interior core position and located in one or more middle conductive interconnect layers to form a top capacitor plate. The capacitor also includes a set of second conductive plates located in the middle conductive interconnect layer(s), a bottom conductive interconnect layer, and a top conductive interconnect layer that are connected together by first conductive via structures to form a bottom capacitor plate, where each second conductive plate has defined finger structures that are vertically aligned such that the defined finger structures of a second conductive plate formed in the middle conductive interconnect layer(s) are interleaved with the first defined finger structure of the top capacitor plate to vertically and horizontally sandwich the top capacitor plate with the bottom capacitor plate. In addition, the capacitor includes a set of third conductive plates formed in the middle conductive interconnect layer(s), the bottom conductive interconnect layer, and the top conductive interconnect layer to surround and shield the top capacitor plate and bottom capacitor plate on at least a plurality of lateral sides, where the set of third conductive plates are connected together and to a reference voltage by a set of conductive via structures, thereby shielding the top capacitor plate from parasitic capacitance. The capacitor may also include a set of fourth conductive plates formed in the middle conductive interconnect layer(s), the bottom conductive interconnect layer, and the top conductive interconnect layer to be peripherally positioned on opposed sides of the top capacitor plate and bottom capacitor plate, where the set of fourth conductive plates are not connected together or to a reference voltage, thereby shielding the top capacitor plate and bottom capacitor plate from capacitive edge effects. In the substrate below the capacitor, a set of conductive active regions may be formed to be aligned in parallel but offset in a first lateral direction from the defined finger structures of a second conductive plate formed in the bottom conductive interconnect layer, where the set of conductive active regions are electrically connected together and to the reference voltage by a set of conductive contact structures, thereby shielding the bottom capacitor plate. In addition, a set of conductive polysilicon layers may be formed over the substrate and below the bottom conductive interconnect layer to be aligned in parallel but offset in a second lateral direction from the defined finger structures of a second conductive plate formed in the bottom conductive interconnect layer, where the set of conductive polysilicon layers are electrically connected together and to the reference voltage by a set of conductive contact structures, thereby shielding the bottom capacitor plate. As disclosed herein, the shielded fringe capacitor may be a metal-oxide-metal (MOM) fringe capacitor formed in a plurality of conductive interconnect layers including a first metal layer forming the bottom conductive interconnect layer, a plurality of intermediate metal layers forming the one or more middle conductive interconnect layers, and a second metal layer forming the top conductive interconnect layer. And in an example implementation, the shielded fringe capacitor may be integrated into a switched capacitor array in a high resolution analog-to-digital converter.

In another form, there is provided a metal-oxide-metal (MOM) fringe capacitor for a high resolution analog-to-digital converter and associated method of fabrication. The disclosed fringe capacitor includes at least three parallel conducting layers, each parallel conducting layer comprising a multi-finger fringe capacitor bottom plate and one or more grounded lateral shielding structures disposed a first present distance from the multi-finger fringe capacitor bottom plate on at least two opposed sides. In selected embodiments, the three parallel conducting layers may also include first and second floating shielding structures disposed to be located a second present distance from one or more grounded lateral shielding structures on at least two peripheral sides. In selected embodiments, the floating shielding structures are not connected together or to a reference voltage, thereby shielding the multi-finger fringe capacitor top plate from capacitive edge effects. The fringe capacitor also includes a multi-finger fringe capacitor top plate formed in at least a first middle conductive layer of the at least three parallel conducting layers and disposed to be spaced apart from and vertically and horizontally sandwiched by multi-finger fringe capacitor bottom plates in the at least three parallel conducting layers and to be surrounded on multiple sides by the one or more grounded lateral shielding structures. As formed, each multi-finger fringe capacitor top plate may include a first plurality of finger structures which are interdigitated with and capacitively coupled to a second plurality of finger structures of a multi-finger fringe capacitor bottom plate. In addition, the fringe capacitor includes one more first via structures electrically connecting the one or more grounded lateral shielding structures in the at least three parallel conducting layers to a ground reference voltage supply. Finally, the fringe capacitor includes one more second via structures electrically connecting the multi-finger fringe capacitor bottom plates in the at least three parallel conducting layers to form a switched bottom capacitor plate with the multi-finger fringe capacitor top plate in a shielded MOM fringe capacitor. In selected embodiments, the MOM fringe capacitor is formed in at least five parallel conducting layers so that the multi-finger fringe capacitor top plate is formed in at least a three middle conductive layer of the at least five parallel conducting layers to be electrically connected by one more third via structures to form a switched top capacitor plate. In selected embodiments, the fringe capacitor may also include a set of conductive polysilicon layers formed over the substrate and below the at least three parallel conducting layers to be aligned in parallel but offset in a first lateral direction from the second plurality of finger structures of the multi-finger fringe capacitor bottom plate formed in a bottom conductive layer of the at least three parallel conducting layers, where the set of conductive polysilicon layers are electrically connected together and to the ground reference voltage supply by a set of conductive contact structures. In addition, a set of conductive active regions may be formed in a substrate below the at least three parallel conducting layers to be aligned in parallel but offset in a second lateral direction from the second plurality of finger structures of the multi-finger fringe capacitor bottom plate formed in a bottom conductive layer of the at least three parallel conducting layers, where the set of conductive active regions are electrically connected together and to the ground reference voltage supply by a set of conductive contact structures. In an example implementation, the shielded MOM fringe capacitor is integrated into a switched capacitor array in a high resolution analog-to-digital converter.

In yet another form, there is provided a capacitor structure formed in multiple metal layers over a substrate. As formed, the capacitor structure includes a bottom metal layer which includes a first multi-finger bottom plate metallization pattern and a first parasitic shielding metallization pattern having one or more first lateral shielding structures disposed a first present distance from the first multi-finger bottom plate metallization pattern on at least two opposed sides. The capacitor structure also includes a first via layer overlying the bottom metal layer, the first via layer including a first subset of vias in contact with the first multi-finger bottom plate metallization pattern and a second subset of vias in contact with the first parasitic shielding metallization pattern. In addition, the capacitor structure includes one or more middle metal layers overlying the first via layer, each having a first multi-finger top plate metallization pattern, a second multi-finger bottom plate metallization pattern vertically aligned at least in part with the first multi-finger bottom plate metallization pattern and in electrical contact with the first subset of vias, and a second parasitic shielding metallization pattern comprising one or more second lateral shielding structures vertically aligned at least in part with the one or more first lateral shielding structures. Overlying the one or more middle metal layers, a second via layer is formed with a third subset of vias in contact with the first multi-finger top plate metallization pattern, a fourth subset of vias in contact with the second multi-finger bottom plate metallization pattern, and a fifth subset of vias in contact with the second parasitic shielding metallization pattern. The capacitor structure also includes a top metal layer which includes a third multi-finger bottom plate metallization pattern vertically aligned at least in part with the second multi-finger bottom plate metallization pattern and in electrical contact with the third subset of vias. The top metal layer also includes a third parasitic shielding metallization pattern having one or more third lateral shielding structures vertically aligned at least in part with the one or more second lateral shielding structures and in electrical contact with the fifth subset of vias. Over the top metal layer, one or more additional conductive shielding metal layers may be formed to be electrically connected in common to a reference voltage. In selected embodiments, the first, second, and third parasitic shielding metallization patterns are electrically connected in common to the reference voltage. In other embodiments, the first, second, and third parasitic shielding metallization patterns are formed as shielding structures that are not connected together or to a reference voltage, thereby shielding the first multi-finger top plate metallization pattern from capacitive edge effects. In an example implementation, the capacitor structure is integrated into a switched capacitor array in a high resolution analog-to-digital converter.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown with simplified geometric features without specifying exact dimensions for size and location in order to avoid limiting or obscuring the present invention, in addition, some portions of the detailed descriptions provided herein are presented with reference to an exemplary switched capacitor circuit that may be employed with a high resolution SAR ADC, but the present invention is not necessarily limited to the example embodiments illustrate herein, and various embodiments of the design and methods disclosed herein may be implemented with other design features and process technologies. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A shielded fringe capacitor formed in at least three conductive interconnect layers, comprising:
   a set of one or more first conductive plates having a first defined finger structure laid out in an interior core position and located in one or more middle conductive interconnect layers to form a top capacitor plate;
   a set of second conductive plates located in the one or more middle conductive interconnect layers, a bottom conductive interconnect layer, and a top conductive interconnect layer and connected together by a first set of conductive via structures to form a bottom capacitor plate, each second conductive plate having defined finger structures that are vertically aligned such that the defined finger structures of a second conductive plate formed in the one or more middle conductive interconnect layers are interleaved with the first defined finger structure of the top capacitor plate, such that that bottom capacitor plate vertically and horizontally sandwiches the top capacitor plate; and
   a set of third conductive plates formed in the one or more middle conductive interconnect layers, the bottom conductive interconnect layer, and the top conductive interconnect layer to surround and shield the top capacitor plate and bottom capacitor plate on at least a plurality of lateral sides, where the set of third conductive plates are connected together and to a reference voltage by a second set of conductive via structures, thereby shielding the top capacitor plate from parasitic capacitance.

2. The shielded fringe capacitor of claim 1, further comprising a set of fourth conductive plates formed in the one or more middle conductive interconnect layers, the bottom conductive interconnect layer, and the top conductive interconnect layer to be peripherally positioned on opposed sides of the top capacitor plate and bottom capacitor plate.

3. The shielded fringe capacitor of claim 2, where the set of fourth conductive plates are not connected together or to a reference voltage, thereby shielding the top capacitor plate and bottom capacitor plate from capacitive edge effects.

4. The shielded fringe capacitor of claim 1, further comprising a set of conductive active regions formed in a substrate below the bottom conductive interconnect layer to be aligned in parallel but offset in a first lateral direction from the defined finger structures of a second conductive plate formed in the bottom conductive interconnect layer, where the set of conductive active regions are electrically connected together and to the reference voltage by a set of conductive contact structures, thereby shielding the bottom capacitor plate.

5. The shielded fringe capacitor of claim 4, further comprising a set of conductive polysilicon layers formed over the substrate and below the bottom conductive interconnect layer to be aligned in parallel but offset in a second lateral direction from the defined finger structures of a second conductive plate formed in the bottom conductive interconnect layer, where the set of conductive polysilicon layers are electrically connected together and to the reference voltage by a set of conductive contact structures, thereby shielding the bottom capacitor plate.

6. The shielded fringe capacitor of claim 1, where the shielded fringe capacitor comprises a metal-oxide-metal (MOM) fringe capacitor formed in a plurality of conductive interconnect layers comprising a first metal layer forming the bottom conductive interconnect layer, a plurality of intermediate metal layers forming the one or more middle conductive interconnect layers, and a second metal layer forming the top conductive interconnect layer.

7. The shielded fringe capacitor of claim 1, where the shielded fringe capacitor is integrated into a switched capacitor array in a high resolution analog-to-digital converter.

8. A metal-oxide-metal (MOM) fringe capacitor for a high resolution analog-to-digital converter comprising:
   at least three parallel conducting layers, each parallel conducting layer comprising a multi-finger fringe capacitor bottom plate and one or more grounded lateral shielding structures disposed a first present distance from the multi-finger fringe capacitor bottom plate on at least two opposed sides;
   a multi-finger fringe capacitor top plate formed in at least a first middle conductive layer of the at least three parallel conducting layers and disposed to be spaced apart from and vertically and horizontally sandwiched by multi-finger fringe capacitor bottom plates in the at least three parallel conducting layers and to be surrounded on multiple sides by the one or more grounded lateral shielding structures;

one more first via structures electrically connecting the one or more grounded lateral shielding structures in the at least three parallel conducting layers to a ground reference voltage supply; and one more second via structures electrically connecting the multi-finger fringe capacitor bottom plates in the at least three parallel conducting layers to form a switched bottom capacitor plate with the multi-finger fringe capacitor top plate in a shielded MOM fringe capacitor.

9. The MOM fringe capacitor of claim 8, where each of the at least three parallel conducting layers further comprises first and second floating shielding structures disposed to be located a second present distance from one or more grounded lateral shielding structures on at least two peripheral sides.

10. The MOM fringe capacitor of claim 9, where the first and second floating shielding structures are not connected together or to a reference voltage, thereby shielding the multi-finger fringe capacitor top plate from capacitive edge effects.

11. The MOM fringe capacitor of claim 8, where the at least three parallel conducting layers comprises at least five parallel conducting layers and where the multi-finger fringe capacitor top plate is formed in at least a three middle conductive layer of the at least five parallel conducting layers to be electrically connected by one more third via structures to form a switched top capacitor plate.

12. The MOM fringe capacitor of claim 8, where each multi-finger fringe capacitor top plate comprises a first plurality of finger structures which are interdigitated with and capacitively coupled to a second plurality of finger structures of a multi-finger fringe capacitor bottom plate.

13. The MOM fringe capacitor of claim 12, further comprising a set of conductive polysilicon layers formed over the substrate and below the at least three parallel conducting layers to be aligned in parallel but offset in a first lateral direction from the second plurality of finger structures of the multi-finger fringe capacitor bottom plate formed in a bottom conductive layer of the at least three parallel conducting layers, where the set of conductive polysilicon layers are electrically connected together and to the ground reference voltage supply by a set of conductive contact structures.

14. The MOM fringe capacitor of claim 13, further comprising a set of conductive active regions formed in a substrate below the at least three parallel conducting layers to be aligned in parallel but offset in a second lateral direction from the second plurality of finger structures of the multi-finger fringe capacitor bottom plate formed in a bottom conductive layer of the at least three parallel conducting layers, where the set of conductive active regions are electrically connected together and to the ground reference voltage supply by a set of conductive contact structures.

15. The MOM fringe capacitor of claim 8, where the shielded MOM fringe capacitor is integrated into a switched capacitor array in a high resolution analog-to-digital converter.

16. A capacitor structure comprising:

a bottom metal layer comprising a first multi-finger bottom plate metallization pattern and a first parasitic shielding metallization pattern comprising one or more first lateral shielding structures disposed a first present distance from the first multi-finger bottom plate metallization pattern on at least two opposed sides;

a first via layer overlying the bottom metal layer, the first via layer comprising a first subset of vias in contact with the first multi-finger bottom plate metallization pattern and a second subset of vias in contact with the first parasitic shielding metallization pattern;

one or more middle metal layers overlying the first via layer, each comprising a first multi-finger top plate metallization pattern, a second multi-finger bottom plate metallization pattern vertically aligned at least in part with the first multi-finger bottom plate metallization pattern and in electrical contact with the first subset of vias, and a second parasitic shielding metallization pattern comprising one or more second lateral shielding structures vertically aligned at least in part with the one or more first lateral shielding structures;

a second via layer overlying the one or more middle metal layers, the second via layer comprising a third subset of vias in contact with the first multi-finger top plate metallization pattern, a fourth subset of vias in contact with the second multi-finger bottom plate metallization pattern, and a fifth subset of vias in contact with the second parasitic shielding metallization pattern; and a top metal layer comprising a third multi-finger bottom plate metallization pattern vertically aligned at least in part with the second multi-finger bottom plate metallization pattern and in electrical contact with the fourth subset of vias, and a third parasitic shielding metallization pattern comprising one or more third lateral shielding structures vertically aligned at least in part with the one or more second lateral shielding structures and in electrical contact with the fifth subset of vias.

17. The capacitor structure of claim 16, where the first parasitic shielding metallization pattern, second parasitic shielding metallization pattern, and third parasitic shielding metallization pattern are electrically connected in common to a reference voltage.

18. The capacitor structure of claim 17, further comprising one or more additional conductive shielding metal layers formed over the top metal layer and connected in common to the reference voltage.

19. The capacitor structure of claim 16, where the first parasitic shielding metallization pattern, second parasitic shielding metallization pattern, and third parasitic shielding metallization pattern comprise shielding structures that are not connected together or to a reference voltage, thereby shielding the first multi-finger top plate metallization pattern from capacitive edge effects.

20. The capacitor structure of claim 16, where the capacitor structure is integrated into a switched capacitor array in a high resolution analog-to-digital converter.

* * * * *